(12) United States Patent
Rathsack et al.

(10) Patent No.: US 9,715,172 B2
(45) Date of Patent: *Jul. 25, 2017

(54) USE OF TOPOGRAPHY TO DIRECT ASSEMBLY OF BLOCK COPOLYMERS IN GRAPHO-EPITAXIAL APPLICATIONS

(71) Applicant: Tokyo Electron Limited, Tokyo (JP)

(72) Inventors: Benjamen M. Rathsack, Austin, TX (US); Mark H. Somervell, Austin, TX (US)

(73) Assignee: Tokyo ELectron Limited, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 15/161,762

(22) Filed: May 23, 2016

(65) Prior Publication Data

US 2016/0268132 A1    Sep. 15, 2016

Related U.S. Application Data

(63) Continuation of application No. 14/517,270, filed on Oct. 17, 2014, now Pat. No. 9,349,604.

(Continued)

(51) Int. Cl.
*G03F 7/004* (2006.01)
*G03F 7/00* (2006.01)

(Continued)

(52) U.S. Cl.
CPC ............ *G03F 7/0002* (2013.01); *G03F 7/091* (2013.01); *G03F 7/165* (2013.01); *G03F 7/40* (2013.01);

(Continued)

(58) Field of Classification Search
CPC .......... G03F 7/002; G03F 7/004; G03F 7/165; G03F 7/30; G03F 7/40; H01L 21/0271; H01L 21/3081; H01L 21/31116

(Continued)

(56) References Cited

U.S. PATENT DOCUMENTS 5,344,742 A   9/1994 Sinta et al.
5,650,261 A   7/1997 Winkle (Continued)

FOREIGN PATENT DOCUMENTS

CN   101681812 A   3/2010
CN   103187245 A   7/2013

(Continued)

OTHER PUBLICATIONS

Japan Patent Office, Official Action issued in related JP Patent Application No. 2016-502295 dated Aug. 23, 2016, 11 pp., including English translation.

(Continued)

*Primary Examiner* — Amanda C Walke
(74) *Attorney, Agent, or Firm* — Wood Herron & Evans LLP

(57) ABSTRACT

A method is provided for forming a patterned topography on a substrate. The substrate is provided with features formed atop that constitute an existing topography, and a template for directed self-assembly (DSA) surrounds the exposed topography. Further to the method, the template is filled with a block copolymer (BCP) to cover the exposed topography, and then the BCP is annealed within the template to drive self-assembly in alignment with the topography. Developing the annealed BCP exposes a DSA pattern immediately overlying the topography.

20 Claims, 7 Drawing Sheets

Related U.S. Application Data

(60) Provisional application No. 61/893,275, filed on Oct. 20, 2013, provisional application No. 61/893,277, filed on Oct. 20, 2013.

(51) Int. Cl.
| | | |
|---|---|---|
| *G03F 7/42* | (2006.01) | |
| *H01L 21/311* | (2006.01) | |
| *G03F 7/16* | (2006.01) | |
| *G03F 7/40* | (2006.01) | |
| *H01L 21/308* | (2006.01) | |
| *H01L 21/027* | (2006.01) | |
| *G03F 7/09* | (2006.01) | |
| *H01L 21/033* | (2006.01) | |
| *H01L 21/3213* | (2006.01) | |

(52) U.S. Cl.
CPC ............ *G03F 7/42* (2013.01); *H01L 21/0273* (2013.01); *H01L 21/0335* (2013.01); *H01L 21/0337* (2013.01); *H01L 21/0338* (2013.01); *H01L 21/3081* (2013.01); *H01L 21/3086* (2013.01); *H01L 21/3088* (2013.01); *H01L 21/31116* (2013.01); *H01L 21/32139* (2013.01)

(58) Field of Classification Search
USPC ...... 430/270.1, 271.1, 273.1, 322, 325, 329, 430/330, 331, 313, 314; 438/706, 710, 438/712, 714, 717, 725
See application file for complete search history.

(56) References Cited

U.S. PATENT DOCUMENTS

| | | | |
|---|---|---|---|
| 5,709,754 | A | 1/1998 | Morinville et al. |
| 5,830,608 | A | 11/1998 | Ishiwata et al. |
| 6,303,477 | B1 | 10/2001 | Ianovitch |
| 6,312,971 | B1 | 11/2001 | Amundson et al. |
| 6,846,748 | B2 | 1/2005 | Chien et al. |
| 6,855,476 | B2 | 2/2005 | Ferreira et al. |
| 7,521,094 | B1 | 4/2009 | Cheng et al. |
| 7,579,278 | B2 | 8/2009 | Sandhu |
| 7,687,220 | B2 | 3/2010 | Yamato et al. |
| 7,723,009 | B2 | 5/2010 | Sandhu et al. |
| 7,754,518 | B2 | 7/2010 | Koelmel et al. |
| 7,811,940 | B2 | 10/2010 | Sandhu |
| 7,923,373 | B2 | 4/2011 | Sandhu |
| 8,039,196 | B2 | 10/2011 | Kim et al. |
| 8,083,953 | B2 | 12/2011 | Millward et al. |
| 8,241,822 | B2 | 8/2012 | Yamato et al. |
| 8,277,564 | B2 | 10/2012 | Le et al. |
| 8,333,522 | B2 | 12/2012 | Arima et al. |
| 8,420,304 | B2 | 4/2013 | Inatomi |
| 8,603,867 | B2 | 12/2013 | Kim et al. |
| 8,790,522 | B1 | 7/2014 | Schmid et al. |
| 8,853,085 | B1 | 10/2014 | Abdallah et al. |
| 8,900,467 | B1* | 12/2014 | Chapuis .................... C08J 7/02 216/41 |
| 8,986,554 | B2 | 3/2015 | Kim et al. |
| 9,005,877 | B2* | 4/2015 | Rathsack ............. G03F 7/0002 430/313 |
| 9,034,197 | B2* | 5/2015 | Lille ....................... G11B 5/855 216/41 |
| 9,190,288 | B2 | 11/2015 | Tanaka et al. |
| 9,339,312 | B2 | 5/2016 | Doherty et al. |
| 9,412,611 | B2* | 8/2016 | Somervell ................. G03F 7/42 |
| 9,418,860 | B2* | 8/2016 | Somervell ................. G03F 7/42 |
| 2002/0192619 | A1 | 12/2002 | Besek |
| 2002/0193619 | A1 | 12/2002 | Crivello et al. |
| 2003/0084925 | A1 | 5/2003 | Nakajima et al. |
| 2003/0227090 | A1 | 12/2003 | Okabe |
| 2005/0056219 | A1 | 3/2005 | Dip et al. |
| 2005/0215713 | A1 | 9/2005 | Hessell et al. |
| 2005/0229427 | A1 | 10/2005 | Sugimoto et al. |
| 2006/0123658 | A1 | 6/2006 | Izumi |
| 2006/0251989 | A1 | 11/2006 | Breyta et al. |
| 2007/0037412 | A1 | 2/2007 | Dip et al. |
| 2007/0155132 | A1 | 7/2007 | Ancilotti et al. |
| 2007/0184656 | A1 | 8/2007 | Sherman et al. |
| 2007/0224823 | A1 | 9/2007 | Sandhu |
| 2007/0237697 | A1 | 10/2007 | Clark |
| 2007/0238028 | A1 | 10/2007 | Inatomi |
| 2008/0032490 | A1 | 2/2008 | Tuominen et al. |
| 2008/0193658 | A1 | 8/2008 | Millward |
| 2008/0311402 | A1 | 12/2008 | Jung et al. |
| 2008/0318005 | A1 | 12/2008 | Millward |
| 2009/0081827 | A1 | 3/2009 | Yang et al. |
| 2009/0087664 | A1 | 4/2009 | Nealey et al. |
| 2009/0181171 | A1 | 7/2009 | Cheng et al. |
| 2009/0200646 | A1 | 8/2009 | Millward et al. |
| 2009/0215272 | A1 | 8/2009 | Sadjadi et al. |
| 2009/0236309 | A1 | 9/2009 | Millward et al. |
| 2009/0291398 | A1 | 11/2009 | Horiuchi |
| 2010/0055621 | A1 | 3/2010 | Hatakeyama et al. |
| 2010/0159214 | A1 | 6/2010 | Hasegawa et al. |
| 2010/0178615 | A1 | 7/2010 | Colburn et al. |
| 2010/0193898 | A1 | 8/2010 | Hautala et al. |
| 2010/0200774 | A1 | 8/2010 | Burke et al. |
| 2010/0227276 | A1 | 9/2010 | Mizuno |
| 2010/0279062 | A1 | 11/2010 | Millward et al. |
| 2011/0033786 | A1 | 2/2011 | Sandhu |
| 2011/0059299 | A1 | 3/2011 | Kim et al. |
| 2011/0147965 | A1 | 6/2011 | Mistry et al. |
| 2011/0147984 | A1 | 6/2011 | Cheng et al. |
| 2011/0147985 | A1 | 6/2011 | Cheng et al. |
| 2011/0151382 | A1 | 6/2011 | Kim et al. |
| 2011/0186544 | A1 | 8/2011 | Endou et al. |
| 2011/0206905 | A1 | 8/2011 | Buriak et al. |
| 2011/0229120 | A1 | 9/2011 | Takaki et al. |
| 2011/0232677 | A1 | 9/2011 | Liu et al. |
| 2011/0272381 | A1 | 11/2011 | Millward et al. |
| 2012/0003587 | A1 | 1/2012 | Kim et al. |
| 2012/0031892 | A1 | 2/2012 | Shigetomi et al. |
| 2012/0046415 | A1 | 2/2012 | Millward et al. |
| 2012/0046421 | A1 | 2/2012 | Darling et al. |
| 2012/0067843 | A1 | 3/2012 | Watanabe et al. |
| 2012/0077127 | A1 | 3/2012 | Sills et al. |
| 2012/0088192 | A1 | 4/2012 | Trefonas et al. |
| 2012/0202017 | A1 | 8/2012 | Nealey et al. |
| 2012/0207940 | A1 | 8/2012 | Muramatsu et al. |
| 2012/0223053 | A1 | 9/2012 | Millward et al. |
| 2012/0312501 | A1 | 12/2012 | Koole et al. |
| 2013/0099362 | A1* | 4/2013 | Kim .................... B81C 1/00031 257/623 |
| 2013/0143406 | A1 | 6/2013 | Hsu et al. |
| 2013/0183827 | A1 | 7/2013 | Millward |
| 2013/0189504 | A1 | 7/2013 | Nealey et al. |
| 2013/0273330 | A1 | 10/2013 | Wang et al. |
| 2013/0292805 | A1 | 11/2013 | Cai et al. |
| 2014/0061154 | A1 | 3/2014 | Kim et al. |
| 2014/0065839 | A1 | 3/2014 | Kawanishi et al. |
| 2014/0099583 | A1 | 4/2014 | Holmes et al. |
| 2014/0116980 | A1 | 5/2014 | Wuister |
| 2014/0127910 | A1* | 5/2014 | Hieno ................. H01L 21/3081 438/703 |
| 2014/0154630 | A1 | 6/2014 | Schmid et al. |
| 2014/0256145 | A1 | 9/2014 | Abdallah et al. |
| 2014/0315390 | A1* | 10/2014 | Abdallah ............ H01L 21/3081 438/703 |
| 2015/0021295 | A1* | 1/2015 | Yoshikawa ........... G03F 7/0002 216/66 |
| 2015/0108087 | A1 | 4/2015 | Somervell et al. |
| 2015/0111387 | A1 | 4/2015 | Somervell et al. |
| 2015/0126034 | A1* | 5/2015 | Latypov ................ H01L 21/308 438/702 |
| 2015/0191034 | A1* | 7/2015 | Millward ............. B81C 99/009 101/451 |

FOREIGN PATENT DOCUMENTS

| | | |
|---|---|---|
| DE | 102012105384 A1 | 9/2012 |
| JP | 1130711 A | 2/1999 |

(56) References Cited

FOREIGN PATENT DOCUMENTS

| | | | |
|---|---|---|---|
| JP | 2002163998 A | 6/2002 |
| JP | 2002265617 A | 9/2002 |
| JP | 2007100191 A | 4/2007 |
| JP | 2007279493 A | 10/2007 |
| JP | 2008036491 A | 2/2008 |
| JP | 201085977 A | 4/2010 |
| JP | 2010527137 A | 8/2010 |
| JP | 2010531051 A | 9/2010 |
| JP | 2011515537 A | 5/2011 |
| JP | 2011522707 A | 8/2011 |
| JP | 2012038969 A | 2/2012 |
| JP | 2012064783 A | 3/2012 |
| JP | 2013164436 A | 8/2013 |
| KR | 20120133272 A | 12/2012 |
| WO | 9627212 A1 | 9/1996 |
| WO | 03016209 A1 | 2/2003 |
| WO | 2008097736 A2 | 8/2008 |
| WO | 2008150673 A1 | 12/2008 |
| WO | 2009100053 A2 | 8/2009 |
| WO | 2009117243 A1 | 9/2009 |
| WO | 2010042290 A2 | 4/2010 |
| WO | 2011018778 A1 | 2/2011 |
| WO | 2011036778 A1 | 3/2011 |
| WO | 20110140200 A1 | 11/2011 |
| WO | 2012071330 A1 | 5/2012 |
| WO | 2012084558 A1 | 6/2012 |
| WO | 2012175343 A1 | 12/2012 |
| WO | 20120175342 A2 | 12/2012 |
| WO | 2013010730 A1 | 1/2013 |

OTHER PUBLICATIONS

Japan Patent Office, Official Action issued in related JP Patent Application No. 2016-500282 dated Sep. 6, 2016, 8 pp., including English translation.
International Searching Authority, Search Report and Written Opinion issued in related International Application No. PCT/US2014/016760 dated Nov. 6, 2014, 11 pages.
Taiwan Intellectual Property Office, English translation of Notification of Examination Opinion issued in related Taiwan Application No. 103108241 on Jun. 12, 2015, 4 pp.
International Search Authority, Search Report and Written Opinion issued in related International Application No. PCT/US14/52292, dated Jan 22, 2015, 12 pp.
Taiwan Intellectual Property Office, Notification of Examination Opinion issued in related Taiwan Application No. 103130469 issued May 21 2015, 9 pp., including English translation.
International Bureau of WIPO, International Preliminary Report on Patentability issued for International related Application No. PCT/US2014/052292 mailed Mar. 17, 2016, 8 pp.
Taiwan Intellectual Property Office, Notification of Examination Opinion issued in related Taiwan Application No. 103136203 dated Aug. 31, 2015, 11 pp., including English translation.
Taiwan Intellectual Property Office, Rejection Decision issued in related Taiwan Application No. 103136203, issued Feb. 22, 2016, 5 pp. including English translation.
Korean Intellectual Property Office, Office Action issued in related Korean Application No. 10-2015-7026370 issued Jul. 15, 2016, 19 pp. including English Translation.
English Translation of Korean Intellectual Property Office, Office Action issued in related Korean Application No. 10-2015-7028220 issued Jul. 15, 2016, 7 pp. (Korean Language document not provided).
Liu et al., "Integration of Block Copolymer Directed Assembly with 193 Immersion Lithography" American Vacuum Society, J. Vac. Sci. Technol. B 28(6), Nov./Dec. 2010, 5 pp.
Bielawski et al., "Regiospecific One-Pot Synthesis of Diaryliodonium Tetrafluoroborates from Arylboronic Acids and Aryl Iodides," J. Org. Chem. 73:4602-4607, 2008.

Cheng et al., "Developing Directly Photodefinable Substrate Guiding Layers for Block Copolymer Directed Self-Assembly (DSA) Patterning," Proc. of SPIE. 7972:79722I(1)-79722I(13), 2011.
Cheng et al., "Simple and Versatile Methods to Integrate Directed Self-Assembly with Optical Lithography Using a Polarity-Switched Photoresist," ACS Nano, 4(8):4815-4823, 2010.
Cheng, et al., "EUVL Compatible, LER Solutions using Functional Block Copolymers," Alternative Lithographic Technologies IV, Proc. of SPIE, vol. 8323, 2012, 11 pp.
Cho et al., "Polymer Bound Photobase Generators and Photoacid Generators for Pitch Division Lithography," Proc. of SPIE. 7972:797221(1)-797221(8), 2011.
Cupta, "Photoacid Generators for Catalytic Decomposition of Polycarbonate," Thesis for Master of Science, Georgia Institute of Technology, 2006, 137 pp.
Gronheid, R.; Rincon Delgadillo, P.; Nealey, P.; Younkin, T.; Matsunaga, K.; Somervell, M. and Nafus, K. Implementations of self-assembly in a 300mm processing environment. IEEE Litho Workshop. (Jun. 25-28, 2012; Williamsburg, VA, USA).
Maki et al., "Photocleavable Molecule for Laser Desorption Ionization Mass Spectrometry," J. Org. Chem. 72:6427-6433, 2007.
Padmanaban et al., "Application of Photodecomposable Base Concept to 193 nm Resists," Proc. of SPIE 3999:1136-1146, 2000.
Ross et al., "Si-containing block copolymers for self-assembled nanolithography," J. Vac. Sci. Technol. B. 26(6)2489-2494, 2008.
Ross et al., "Templated Self-Assembly of Block Copolymer Films," 2012 Materials Research Society (MRS) Fall Meeting & Exhibit, Symposium S: Directed Self-Assembly for Nanopatterning, Nov. 25-30, 2012, Boston, Massachussetts, 64 pp.
Gotrik et al., "Thermosolvent Annealing of Block Copolymer Thin Films for Directed Self-Assembly Applications," 2012 Materials Research Society (MRS) Fall Meeting & Exhibit, Symposium S: Directed Self-Assembly for Nanopatterning, Nov. 25-30, 2012, Boston, Massachussetts, 15 pp.
Ruebner et al., "A cyclodextrin dimer with a photocleavable linker as a possible carrier for the photosensitizer in photodynamic tumor therapy," PNAS. 96(26):14692-14693, 1999.
Skulski, "Organic Iodine(I, III, and V) Chemistry: 10 Years of Development at the Medical University of Warsaw, Poland," Molecules. 5:1331-1371, 2000.
Weissman et al., "Recent advances in ether dealkylation," Tetrahedron. 61:7833-7863, 2005.
Gotrik et al., "Morphology Control in Block Copolymer Films Using Mixed Solvent Vapors," ACS Nano, 6 (9):8052-8059, 2012.
Hammersky et al., "Self-Diffusion of a Polystyrene-Polyisoprene Block Copolymer," Journal of Polymer Science: Part B: Polymer Physics. 34:2899-2909, 1996.
Jung et al., "Orientation-Controlled Self-Assembled Nanolithography Using a Polystyrene-Polydimethylsiloxane Block Copolymer," Nano Lett. 7(7):2046-2050, 2007.
Jung et al., "A Path to Ultranarrow Patterns Using Self-Assembled Lithography," Nano Lett. 10:1000-1005, 2010.
Postnikov et al., "Study of resolution limits due to intrinsic bias in chemically amplified photoresists," J. Vac. Sci. Technol. B. 17(6):3335-3338, 1999.
Rathsack et al., "Pattern Scaling with Directed Self Assembly Through Lithography and Etch Process Integrations," Proc. of SPIE 8323, Alternative Lithographic Technologies IV, 83230B (Mar. 1, 2012); doi:10.1117/12.916311, 14 pp.
Choi et al., "Square Arrays of Holes and Dots Patterned from a Linear ABC Triblock Terpolymer," ACS Nano, 6(9):8342-8348, 2012.
Foubert et al., "Impact of post-litho LWR smoothing processes on the post-etch patterning result," Proc. of SPIE, 7972:797213(1)-797213(10), 2011.
Tavakkoli K.G. et al., "Templating Three-Dimensional Self-Assembled Structures in Bilayer Block Copolymer Films," Science, 336:1294-1298, 2012.

(56) References Cited

OTHER PUBLICATIONS

Cushen et al., "Oligosaccharide/Silicon-Containing Block Copolymers with 5 nm Features for Lithographic Applications" ACS Nano, vol. 6, No. 4, 2012, pp. 3424-3433.

Dean, et al., "Orientation Control of Silicon-containing Block Copolymer Films," Dept. of Chemical Engineering, The University of Texas at Austin, 1 p.

Jarnagin, et al., "Investigation of High c Block Copolymers for Directed Self-Assembly: Synthesis and Characterization of PS-b-PHOST," Alternative Lithographic Technologies IV, Proc. of SPIE, vol. 8323, 2012, 9 pp.

Steven J. Lickteig et al., Optimization of an Integrated and Automated Macro Inspection System for the Utilization of Wafer Color Variation Detection in a Photolithography Cluster, Metrology, Inspection, and Process Control for Microlithography, Proc. of SPIE vol. 6152, 9 pages.

Zhao et al., "Self-reorganization of mixed poly(methyl methacrylate)/polystyrene brushes on planar silica substrates in reponse to combined selective solvent treatments and thermal annealing", Polymer 45 (2004) 7979-7988.

Vayer et al., "Perpendicular orientation of cylindrical domains upon solvent annealing thin films of polystyrene-b-polylactide", Thin Solid Films 518 (2010) 3710-3715.

Peng et al., "Development of Nanodomain and Fractal Morphologies in Solvent Annealed Block Copolymer Thin Films", Macromolecular Rapid Communications 2007, 28, 1422-1428.

Yu et al., "Self-assembly of polystyrene—poly(4-vinylpyridine) in deoxycholic acid melt", Polymer, Elsevier Science Publishers B.V, GB, vol. 52, No. 18, Jul. 13, 2011, pp. 3994-4000.

Korean Intellectual Property Office, Office Action issued in related Korean Application No. 10-2015-7026176 dated Dec. 5, 2016, 9 pp. including English translation.

Japan Patent Office, Official Action issued in related JP Patent Application No. 2015-512726 issued Jan. 4, 2017, 14 pp., including English translation.

Japan Patent Office, Office Action issued in related Patent Application No. JP2016-500283 mailed Dec. 20, 2016, 19 pp., including English translation.

Japan Patent Office, Office Action issued in counterpart JP Patent Application No. 2016-549215 mailed Feb. 28, 2017, 6 pp., including English translation.

\* cited by examiner

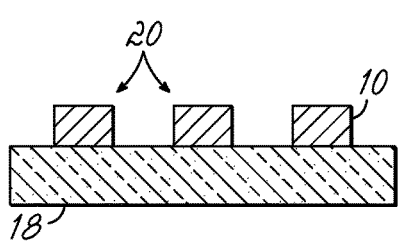
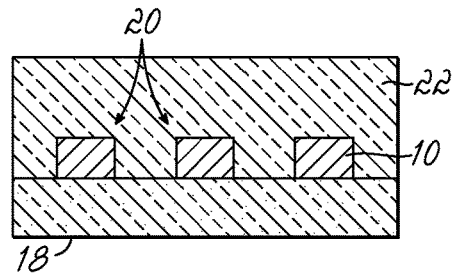
FIG. 3A  FIG. 3B
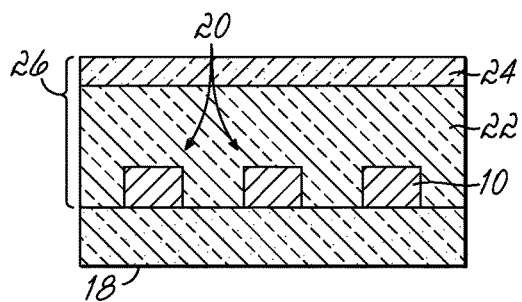
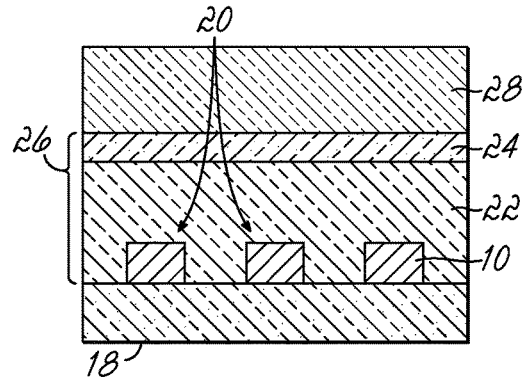
FIG. 3C  FIG. 3D
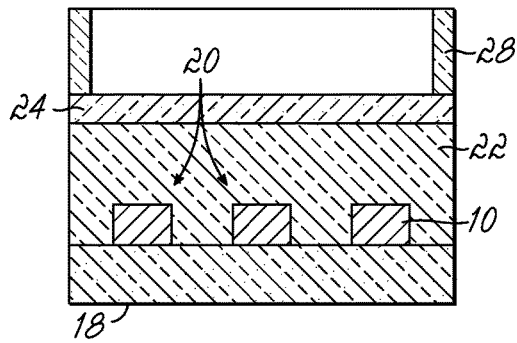
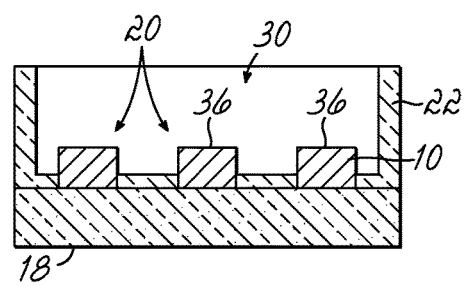
FIG. 3E  FIG. 3F

WITHOUT TOPOGRAPHY

WITH TOPOGRAPHY

USE OF TOPOGRAPHY TO DIRECT ASSEMBLY OF BLOCK COPOLYMERS IN GRAPHO-EPITAXIAL APPLICATIONS

This application is a continuation of co-pending U.S. patent application Ser. No. 14/517,270 filed Oct. 17, 2014 and entitled USE OF TOPOGRAPHY TO DIRECT ASSEMBLY OF BLOCK COPOLYMERS IN GRAPHO-EPITAXIAL APPLICATIONS, which claims the benefit of and priority to U.S. Provisional Patent Application Nos. 61/893,275 and 61/893,277, each filed on Oct. 20, 2013, the disclosures of which are hereby incorporated by reference herein in their entirety.

FIELD OF THE INVENTION

This invention relates to Directed Self-Assembly (DSA) of block copolymers (BCPs) and, more specifically, the use of grapho-epitaxy and optionally chemo-epitaxy to drive the assembly of a BCP for semiconductor patterning.

BACKGROUND OF THE INVENTION

The industry is running out of cost-effective ways to make small patterns in integrated circuit (IC) designs, especially hole structures. FIG. 1 illustrates schematically the need for such small hole structures. An array of lines 10 form a topography 20 on a substrate. The lines 10 need to be cut in a typical design, for example, a 10 nm node design. Square-shaped holes 12 and rectangle-shaped holes 14 would be patterned to allow access to the lines 10 for cutting. As the area of the entire pattern shrinks, smaller holes 12, 14 must be patterned, and the space between holes gets tighter as well. Historically, lithographic applications have been able to print all of these holes in a single print. However, currently, multiple exposure passes are required to print the different holes because they are so close together and so small, and by the time the 10 nm node arrives, it is likely that as many as four masks will be required to print even this simple geometry.

Block copolymers (BCPs) are being investigated for their use in making fine patterns because they can thermodynamically form very small domains of regular structures currently used in semiconductor patterning (e.g., cylinder or line/space patterns). Typically, in these systems, the assembly of the BCP is directed by an external driving force. One such method for directing the BCP assembly is through the use of physical templates. However, there is a need for methods for directing the assembly of BCPs that enable greater control of the interfaces of the blocks to allow for more precise creation of the exact shapes needed to make fine circuit patterns.

SUMMARY OF THE INVENTION

A method is provided for forming a patterned topography on a substrate. The substrate is provided with features formed atop that constitute an existing topography, and a template for directed self-assembly (DSA) surrounds the exposed topography. Further to the method, the template is filled with a block copolymer (BCP) to cover the exposed topography, and then the block copolymer (BCP) is annealed within the template to drive self-assembly in alignment with the topography. Developing the annealed block copolymer (BCP) exposes a directed self-assembly (DSA) pattern immediately overlying the topography.

In one embodiment, the template is provided by applying a planarization layer on the topography, applying an antireflective layer over the planarization layer, and applying a layer of radiation-sensitive material over the antireflective layer, which layer of radiation-sensitive material is then patterned to form an image. The image is then transferred into the planarization layer by etching the antireflective layer and planarization layer to expose the topography, followed by stripping any remaining portions of the radiation-sensitive material layer and the antireflective layer to leave the exposed topography surrounded by the template for directed self-assembly (DSA) formed by remaining portions of the planarization layer.

In one embodiment, a difference in surface energy is created between the topography and the template, and the annealing of the block copolymer (BCP) within the template drives self-assembly under the influence of the difference in surface energy.

BRIEF DESCRIPTION OF THE DRAWINGS

The accompanying drawings, which are incorporated in and constitute a part of this specification, illustrate embodiments of the present invention and, together with a general description of the invention given above, and the detailed description of the embodiments given below, serve to explain the principles of the present invention.

FIGS. 3A-3L depict in schematic cross-sectional view an embodiment of a method for patterning a topography on a substrate using directed self-assembly.

DETAILED DESCRIPTION

Figure 1:
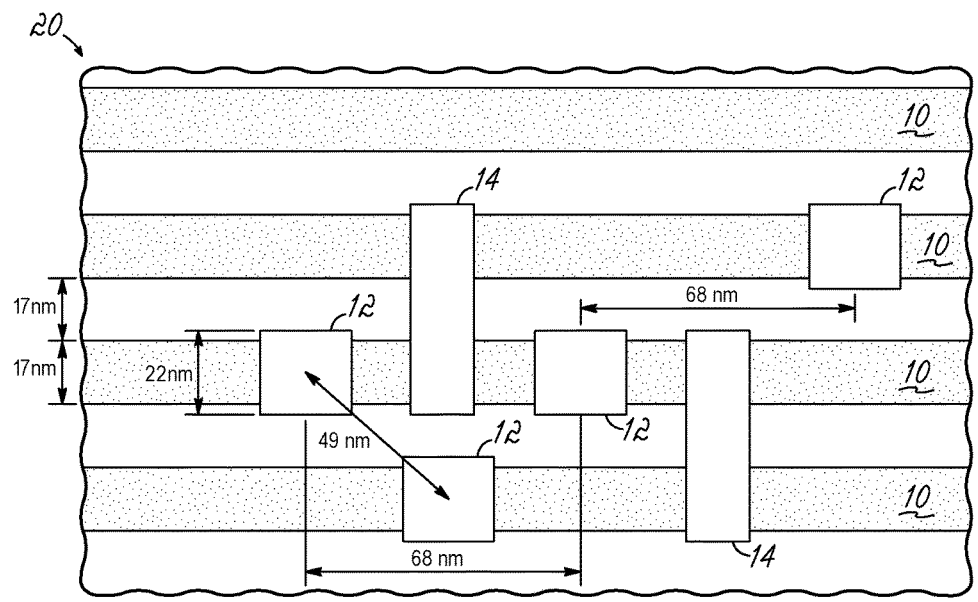
FIG. 1 is a schematic depiction of a line array with hole patterning for cutting the lines.

Methods using grapho-epitaxy and chemo-epitaxy to drive the assembly of a block copolymer for semiconductor patterning are disclosed in various embodiments. However, one skilled in the relevant art will recognize that the various embodiments may be practiced without one or more of the specific details or with other replacement and/or additional methods, materials, or components. In other instances, well-known structures, materials, or operations are not shown or described in detail to avoid obscuring aspects of various embodiments of the present invention.

Similarly, for purposes of explanation, specific numbers, materials, and configurations are set forth in order to provide a thorough understanding. Nevertheless, the embodiments of the present invention may be practiced without specific details. Furthermore, it is understood that the illustrative representations are not necessarily drawn to scale.

Reference throughout this specification to "one embodiment" or "an embodiment" or variation thereof means that a particular feature, structure, material, or characteristic described in connection with the embodiment is included in at least one embodiment of the invention, but does not denote that they are present in every embodiment. Thus, the appearances of the phrases such as "in one embodiment" or "in an embodiment" in various places throughout this specification are not necessarily referring to the same embodiment of the invention. Furthermore, the particular features, structures, materials, or characteristics may be combined in any suitable manner in one or more embodiments. Various additional layers and/or structures may be included and/or described features may be omitted in other embodiments.

Additionally, it is to be understood that "a" or "an" may mean "one or more" unless explicitly stated otherwise.

Various operations will be described as multiple discrete operations in turn, in a manner that is most helpful in understanding the invention. However, the order of description should not be construed as to imply that these operations are necessarily order dependent. In particular, these operations need not be performed in the order of presentation. Operations described may be performed in a different order than the described embodiment.

Various additional operations may be performed and/or described operations may be omitted in additional embodiments.

As described above, one method for directing the BCP assembly is through the use of physical templates. Another method is to build a chemical activity difference into the substrate so that one or both blocks of the BCP will align with the preferred substrate. In all such integrations, the key to good block copolymer assembly is the interaction of the block copolymer with the surfaces that it comes into contact with. Whether chemo-epitaxy or grapho-epitaxy is used, the interaction of the BCP with both the substrate and the sidewalls that it comes into contact with will determine how it chooses to self-assemble. In accordance with the invention, methods for directing the assembly of block copolymers are disclosed that enable greater control of the interfaces of the blocks to allow for more precise creation of the exact shapes needed to make fine circuit patterns.

Figure 2:
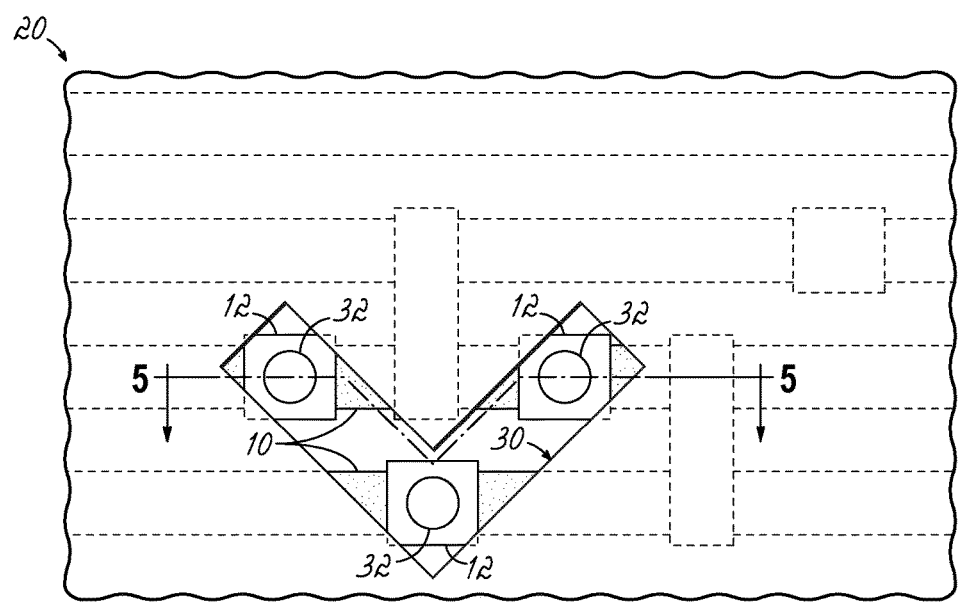
FIG. 2 schematically depicts formation of a graphical template over the array of FIG. 1.

FIG. 2 schematically illustrates simplification of this process using DSA. A graphical template 30 is formed over the topography 20 of FIG. 1 to provide the location for holes 12 (three shown) that can be used to cut the lines 10. The holes 12 that would require multiple patterning are now being created through 1) patterning of a template 30 and 2) using this template 30 to place the holes 12 that will allow access to cut the lines 10. In addition to the template 30, and in accordance with embodiments of the invention, the directed assembly of the holes 12 is augmented by utilizing the topography 20. Specifically, if the topography 20 has or is treated in such a way that its chemical activity favors the assembly of cylinders 32 on top of it, then the holes 12 can be anchored to the topography 20. Thus, the invention is a DSA application that uses a hybrid grapho/chemo epitaxy approach. It is graphical in that it uses the guiding template 30, and it is chemical in that it uses the surface energy of the topography 20 to further augment the placement of the holes 12.

The following is a more detailed discussion of two different embodiments of the invention that utilize this approach of using aspects of both grapho-epitaxy and chemo-epitaxy to drive the assembly of the BCP in specific locations. In both embodiments, chemical treatment of a topography may be used to drive the assembly of a block copolymer within a graphical template. This specific technology is used within an overall wafer flow to generate the desired structures. However, it may be appreciated that the chemo-epitaxy aspect may be achieved without chemical treatment, such as by selecting materials for the topography and template that provide the chemical differences inherently that drive the assembly.

Figure 3G:
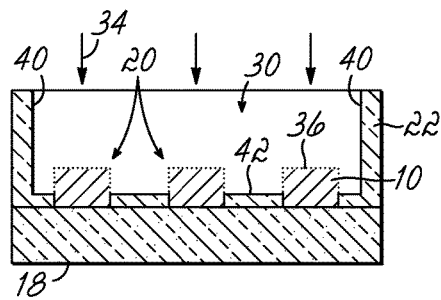

In the first embodiment, depicted in schematic cross-sectional view in FIGS. 3A-3L, an array of features, specifically lines 10, has been patterned on a substrate 18, such as a semiconductor wafer, to provide a starting topography 20, as shown in FIG. 3A, and the desire is to cut these lines 10 in specific locations. To that end, in FIG. 3B, a planarization layer 22 is applied to planarize the topography 20. Planarization layer 22 may be, for example, a spin-on carbon layer. The planarization layer 22 will ultimately form the template for the grapho-epitaxy aspect of the invention. Next, as shown in FIG. 3C, an anti-reflective coating (ARC) layer 24, such as a silicon ARC, is coated on top of the planarization layer 22. It may be understood that the ARC layer 24 may not by itself act as an antireflective coating, but rather, is more generically a second layer that acts in combination with the planarization layer to provide a dual-layer bottom ARC (BARC) 26. Nonetheless, the second layer (layer 24) may be referred to as an ARC layer for the reason that it provides the antireflective properties when combined with the first layer (planarization layer 22). The thicknesses and optical properties of these layers, which form the dual-layer BARC 26, are tailored so that the substrate reflectivity is minimized.

A layer of radiation-sensitive material, e.g., photoresist 28, is coated, as shown in FIG. 3D, and patterned (imaged) on top of this dual-layer BARC 26, as shown in FIG. 3E, and the photoresist image is subsequently transferred into the planarization layer 22 through traditional reactive ion etching (RIE) processing, as shown in FIG. 3F (the photoresist 28 and ARC layer 24 are also removed) thereby forming the template 30 in the planarization layer 22. The depth of etching into the planarization layer 22 may be complete, so as to expose an upper surface of the underlying substrate 18, or partial, so as to leave a portion of the planarization layer 22 at the bottom of the template 30. In either case, surface portions 36 of the lines 10 are exposed, so as to reveal an exposed topography 20 surrounded by the template 30.

The next step, depicted in FIG. 3G, is an optional surface treatment 34 of the pattern transferred into the planarization layer 22 that will impact the self-assembly of the BCP. As described below in more detail, this treatment is needed in some cases and is not needed in other cases. Further, the surface treatment can effect a change in surface properties of certain surfaces while leaving other surfaces unchanged. For example, as depicted in FIG. 3G, the surface treatment 34 can alter the exposed surface portions 36 of the lines 10, while leaving the sidewalls 40 and bottom surfaces 42 of the template 30 unchanged.

Figure 3H:
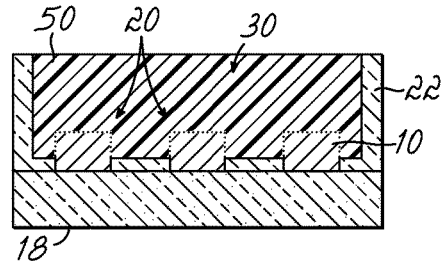
Figure 3I:
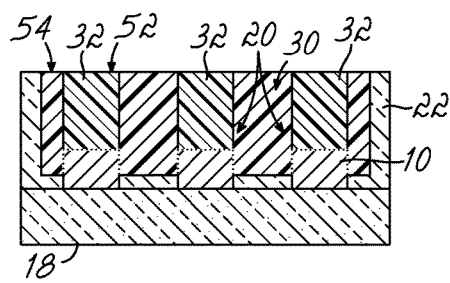
Figure 3J:
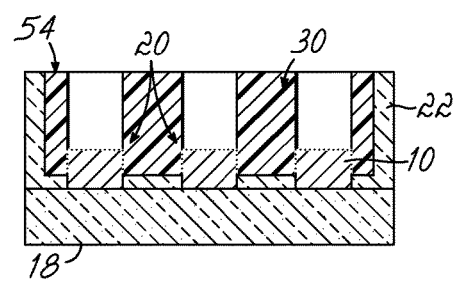
Figure 3K:
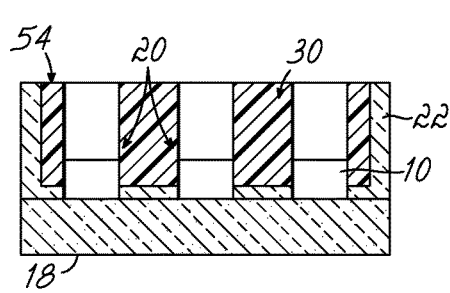
Figure 3L:
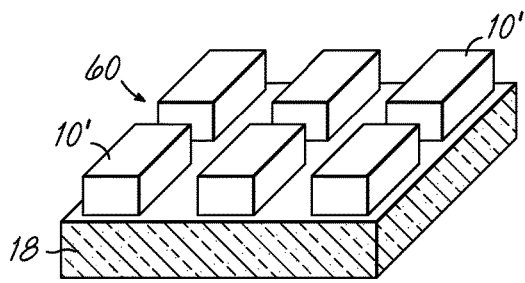

After this optional surface treatment, a BCP 50 is applied to the pattern, as shown in FIG. 3H to fill the template 30 (partially or completely), and then annealed allowing the BCP to form a cylindrical morphology, as shown in FIG. 3I. More specifically, the anneal causes a first block 52 of the BCP to form a plurality of cylinders 32 aligned over the lines 10 within a matrix of a second block 54 of the BCP. Subsequent development of the BCP 50 to remove the cylindrical morphology, i.e., the first block 52 of the BCP 50, as shown in FIG. 3J, gives access to the topography 20 by exposing the DSA pattern immediately overlying the topography 20. There is then access to make the appropriate cuts of the underlying array of lines 10, as shown in FIG. 3K, so etching can be done and selected lines 10 cut, as the circuit design requires, to form a patterned topography. The substrate 18 is then stripped to reveal the patterned topography, i.e., an array 60 of cut lines 10', as shown in FIG. 3L.

Figure 4:
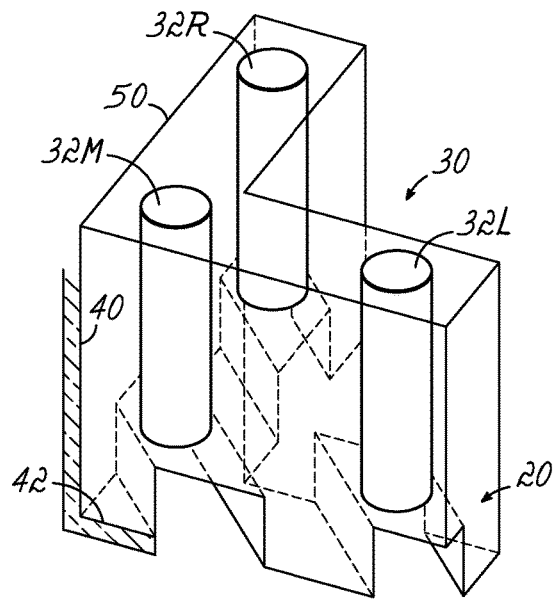
FIG. 4 is a perspective view of the template of FIG. 2 used in a simulation study.

For the process flow of FIGS. 3A-3L to be optimized, there are a host of variables that can be leveraged. Specifically, the shape of the template 30 and how the topography 20 is aligned in that template 30, as well as the surface energies of the different surfaces can be adjusted. Therefore, this approach is a combination of chemo- and grapho-epitaxy. The importance of the chemo-epitaxy in this approach can be seen through a simulation study that was completed using a Monte Carlo code. The area depicted in FIG. 2, shown in perspective view in FIG. 4, was used for the simulation, and the BCP 50 was polystyrene/polymethyl methacrylate (PS/PMMA), with the PMMA block forming the cylindrical morphology.

In the simulation study, the parameters that were plotted are surface interaction parameters, which are presented on a normalized 0-2.0 scale that represents the full degree of wetting that may be observed in the system. $\Lambda_s$ refers to the interaction between the PMMA block of the BCP 50 and the sidewall 40 of the template 30 in normalized simulation units; $\Lambda_T$ refers to the interaction between the PMMA block of the BCP 10 and the topography 20. There is a third interaction, $\Lambda_b$, that describes the interaction between the PMMA block of the BCP and the bottom surface 42 of the template. $\Lambda_b$ was kept constant for the set of simulations at a value of 1.0. The pictures in FIG. 5 were taken along line 5-5 of FIG. 2, and are the perspective of one looking at the junction of the V. The cylinder in the middle, $32_M$, is located at the junction, and the cylinders at the left and right, $32_L$ and $32_R$, respectively, are located at the end of each arm of the template. It is clear that controlling the chemical nature of the surfaces has a large impact on the type of assembly that is observed. For example, in the point at $\Lambda_T=0.2$ and $\Lambda_s=1.0$, it can be seen that all three cylinders, $32_L$, $32_M$, and $32_R$, connect from the surface of the BCP 50 to the topography 20 itself. There are also parallel cylinders 33 that connect these three vertical cylinders $32_L$, $32_M$, and $32_R$ together. This type of three-dimensional structure can be used to cut features such as gates. In a first step, the PMMA could be etched out through the use of a RIE etch step, and a second etch step could then be used to cut the lines. On the other hand, viewing the simulation results where $\Lambda_T=2.0$ and $\Lambda_s=0.2$, none of the three cylinders $32_L$, $32_M$, and $32_R$ are contacting the topography 20. Finally, in the simulation where $\Lambda_T=2.0$ and $\Lambda_s=1.6$, it can be seen that the cylinder $32_M$ at the junction of the V is connected to the topography 20, but the other two cylinders, $32_L$ and $32_R$, are not. For these last two conditions, transfer of the pattern to cut the lines 10 could be difficult because all three of the cylinders $32_L$, $32_M$, and $32_R$ are not open to the topography 20.

The simulation study also illustrates that having too high of a positive interaction on the topography 20 can lead to a disconnected cylinder 32. In these cases, a wetting layer of PMMA forms on top of the topography 20, but does not connect fully with the cylinder 32. Though counter-intuitive, one can imagine the situation where the very high attraction between this phase of the BCP and the topography causes a tension in the cylinder (akin to pulling a piece of gum). The BCP has some elasticity and can stretch if this tension is not too great, but if it is, then the cylinder breaks and forms two different pieces—one wetting the topography, and one hovering in the majority phase, disconnected from the topography.

Figure 5:
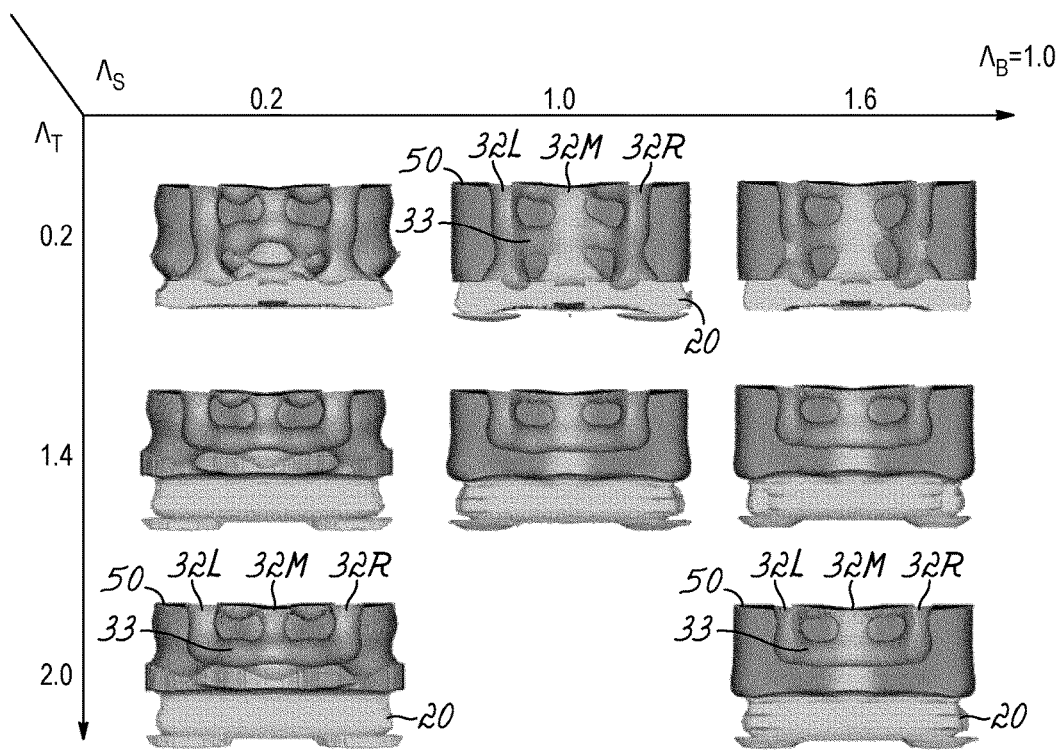
FIG. 5 is a plot of images in the simulation study taken along line 5-5 of FIG. 2 for different surface interaction parameters.

The simulation study depicted in FIG. 5 thus illustrates the importance of chemo-epitaxy on the formation of the structures within the V-shaped template. The importance of grapho-epitaxy in this scenario is illustrated by comparing a case where the topography in the template is removed.

Figure 6A:
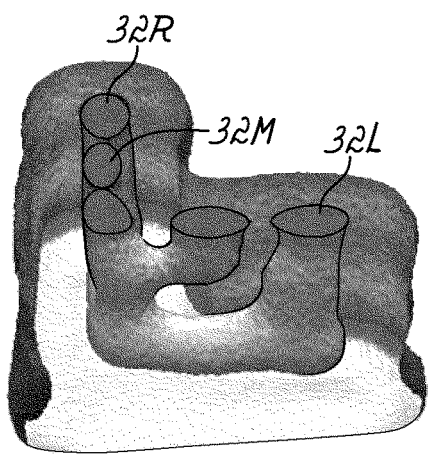
FIGS. 6A-6B are 3-dimensional views of a DSA pattern, formed without and with a topography in the template.
Figure 6B:
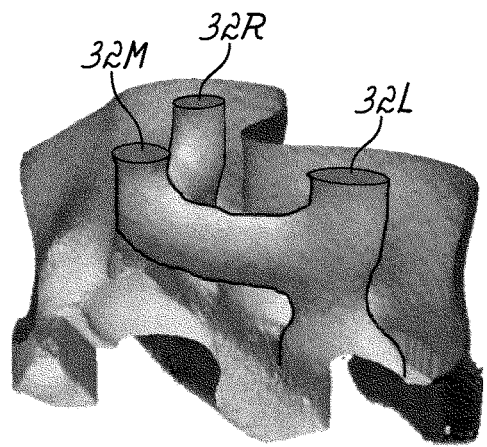

As shown in FIG. 6A, the structure formed without topography has an additional two cylinders branching out of the cylinder $32_M$ located at the V of the template 30, whereas the template 30 with the topography 20, shown in FIG. 6B, has two cylinders $32_L$ and $32_R$ attached to the topography and one cylinder $32_M$ that does not connect. The added volume of the template left by the topography allows the minority phase of the BCP to have more room to form this complicated geometry and so it does.

Finally, the present disclosure addresses means for effecting different chemical interactions on the different surfaces. The simulation studies illustrate that the interaction at the bottom surface 42 (i.e., at or near the interface with the substrate 18) is not very critical when there is topography 20 within the template 30. The simplest way to impart the necessary surface properties on the sidewall 40 of the template and on the topography, i.e., on the surfaces of the lines 10, is for the materials selected to have these conditions naturally. So, in creating such structures, materials are selected for the topography and the template that have different surface properties and can be used to manipulate the geometry. Therefore, the chemo-epitaxy aspect of the invention may be achieved through material selection, making a surface treatment step unnecessary. Alternatively, if the structures are not selected with the desired properties, there are a variety of process steps that can be used to change the surface properties after creation of the template.

One method for altering the surface properties is the use of liquid rinses. Acid rinses may be used, with a subsequent bake step causing acid catalyzed deprotection of a surface (while leaving the other surfaces intact). This would provide control of the polarity of a surface. By way of example and not limitation, acid rinses may include low concentrations of strong acids such as HCl, $H_2SO_4$, $HNO_3$, $HSO_3F$, or fluorine-based acetic acids at pH>2. Weak acids like acetic acid may also be used, again maintaining a pH>2. One skilled in the art may appreciated that other acid solutions may used provided they are not detrimental to the hardware used in the processing system. Basic rinses, such as common photoresist developer, may be used to change the contact angle of one or more surfaces. By way of example and not limitation, Basic rinses may include tetramethyl ammonium hydroxide (TMAH), specifically at standard developer concentrations (0.26N), tetra-butyl ammonium hydroxide, tertiary amines (e.g., trioctyl amine) or secondary amines. Solvent rinses may be used, which can potentially solubilize and remove small molecular weight compounds that exist in or near the surfaces. By way of example and not limitation, solvents may include propylene glycol methyl ether acetate (PG-MEA), ethyl lactate, n-butyl acetate, gamma butyrolactone, cyclohexanone, or 2-heptanone (methyl amyl ketone). Cleaning rinses may be used, including standard chemistry used in the industry to prepare surfaces for further processing in microelectronics. The cleaning rinses can change the surface properties of the interfaces. By way of example and not limitation, such chemistries include dimethyl sulfoxide (DMSO), TMAH, DMSO+TMAH (Orgasolv™), SC1 (40 parts deionized water, 1 part hydrogen peroxide, 1 part ammonia hydroxide), SC2 (160 parts deionized water, 4 parts hydrogen peroxide, 1 part hydrochloric acid), monomethyl ether acetate (MEA), and DMSO+MEA. Reactive rinses may be used, which can react with a surface to change the nature of the surface. One example is a silylating agent that reacts with free acidic OH groups to leave a silicon group attached to the surface. For example, a liquid hexamethyldisilazane (HMDS) treatment may be used.

Another method for altering the surface properties is the use of brush coatings polymers, which can be coated on the template structure to change the surface to either polar or non-polar. These brush coatings can be modified so that they can selectively graft to one surface without grafting to another surface. The excess can be rinsed to remove the non-grafted brush from one or more of the surfaces of interest. By way of example and not limitation, the brush coating may comprise one phase of the BCP, advantageously with a hydroxyl termination, such as OH-terminated PMMA or OH-terminated PS.

Other methods for altering the surface properties include the use of UV treatment or ozonation. Some materials will undergo chemical and surface changes in the presence of deep UV (DUV) radiation. Such chemical changes can be used to change the surface energy of a substrate. DUV plus heat can cause cross-linking of organic materials. Ozonation, which is UV treatment with oxygen, tends to oxidize surfaces to make them more hydrophilic. Ozonation can be completed by generating ozone in situ (oxygen+172 nm light) in the presence of the substrate, through the use of ozonated water, or direct treatment with ozone itself.

Other methods for altering the surface properties include the use of plasma treatments, direct current superposition (DCS) cure, electron beam (E-Beam) curing, and gas cluster ion beam (GCIB) treatment. Plasma treatments can be used to generate radicals, which can react with surfaces and change their properties. They can also be used to create polymers which will deposit on the wafer. Treatment with DCS also forms an oxidized surface. DCS is both a cross-linking (curing) and $SiO_2$ deposition method. DCS is conducted in a capacitively coupled plasma (CCP) reactor where a negative DC voltage is imposed upon a top silicon electrode, and the negative voltage superposition accelerates ions from plasma towards the top electrode resulting in high energy ion-bombardment on the top electrode. Secondary electrons are thereby produced which become ballistic upon being accelerated through the DC sheath. Ion-bombardment also causes physical sputtering of Si from the top electrode. Both the ballistic electrons and the sputtered Si rain down upon the substrate sitting on the bottom electrode. The thin Si coating formed on the substrate is then instantaneously oxidized upon exposure to air/moisture. E-Beam curing can cause surface changes similar to oxidative changes. In a GCIB treatment, ions can attack horizontal surfaces while leaving vertical surfaces unchanged. In some cases, polymers can be deposited on horizontal surfaces as well.

Another method for altering the surface properties is the use of gas treatments. Reactive vapors, like HMDS or other vapor silylating agents, can graft to some surfaces and change the contact angle (akin to the liquid reactive rinse with HMDS discussed above, but in gas phase).

Another method for altering the surface properties is the use of sequential infiltration synthesis (SIS) treatment, which is a means of doing sequential gas or liquid treatments to grow units on and in a material, one reaction at a time. The reactions tend to work from the outside in. Argonne National Labs has a SIS treatment system that uses trimethyl aluminum as the critical agent, which reacts with ester groups to incorporate aluminum into a film.

Assuming that the materials are different, some of the surface-altering processing above will have a natural selectivity that can thus result in selective changes in surface energy. In other cases, the presence of reactive sites at the surface of one material or another can allow for selective incorporation of a surface-changing material.

Although simulations have not shown a strong dependence on the chemical activity of the bottom surface 42 of the template, it is possible to envision situations where that surface does come into play. In that case, for example, sequential treatments of the template where one process is designed to treat the topography and one process is designed to treat the bottom of the template may be used. As an example, in a first step, the template is treated with a first brush polymer that can only graft to the topography, followed by a rinse to remove any excess, and in a second step, the template is treated with a second brush polymer that can only graft to the bottom of the template, followed by a rinse to remove any excess. Furthermore, there are cases where the topography might have the desired chemical activity, and so treatment of the bottom alone would be required. Therefore, the processes listed above to help create a difference in chemical activity between the sidewall and the topography can also be used to create differences in the template bottom as well.

While embodiments of the invention have been described with reference to an example of attaching a DSA pattern to an existing topography comprising an array of lines to be cut, the method is also applicable with little modification for attachment of a DSA pattern to any kind of topography, whether in a regular array, or not, as long as the template is formed for the grapho-epitaxy aspect, and as long as the appropriate chemical activity is inherently possessed by the template, topography, and bottom for the chemo-epitaxy aspect, either inherently or through surface treatment. In the latter aspect, as described above, various chemical treatments can be used to alter the chemical activities of any or all of the template, topography, and bottom, to facilitate self-assembly immediately on top of the existing topography.

In a second embodiment, the same concepts described above in reference to FIGS. 3A-3L are applicable for a different purpose. Consider the case where it is desired to use a graphical trench to drive the assembly of a series of contact holes. Such an application can include any number of contacts within a narrow trench, and can also be extended to cases where the trench has turns (like T's or L's). Prior work on this kind of application has revealed a shortcoming in that the holes are not perfectly placed as desired, with respect to the underlying topography. The prior work shows that placement error of two holes in the template is approximately 1.0 nm in the short axis and 1.3 nm in the long axis, and as the trench gets longer and longer, the image placement in the short axis stays relatively constant, but the offset in the long-axis continues to increase. The implication is that where the holes are well-confined (i.e., the short axis), their placement is better than when they have additional freedom to move (i.e., the long axis). Since the placement of patterns is as critical as the dimension of the feature, there is concern that the tendency of these cylinders to shift within the templates may make it difficult to bring this technology to high-volume manufacturing.

Figure 7:
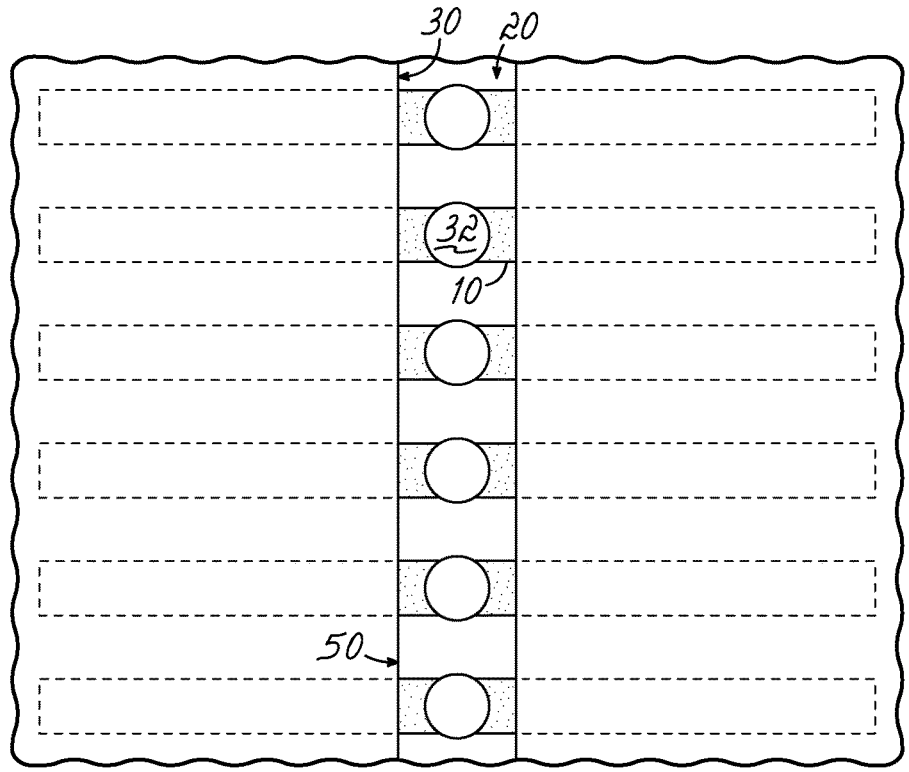
FIG. 7 is a top schematic view of a template overlying a topography with a DSA pattern tethered to the topography.

The present invention solves this issue by placing a topography 20 within the template 30, and using it to tether the cylindrical phases 32 of the BCP 50 in place, as shown in FIG. 7. The graphical template 30 will maintain the placement of the contact holes in the narrow direction. By appropriate treatment of the topography 20, the chemical interaction will maintain the placement of the contact holes in the long axis of the template 30 (or near infinite axis in the case of a long trench with contact holes.)

One benefit of this approach is that the resulting structure (holes 16 making contact to lines 10) is a standard structure for contacts and gates or via and trenches, and the invention facilitates the construction of a needed component.

Figure 8A:
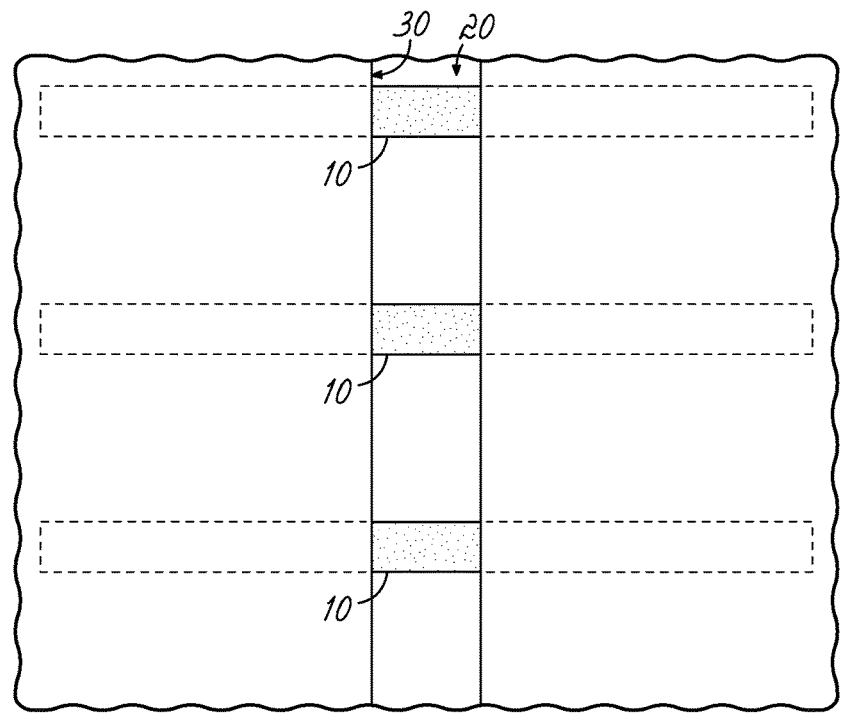
FIGS. 8A-8C are top schematic views of a method for tethering a DSA pattern to a topography according to an embodiment.
Figure 8B:
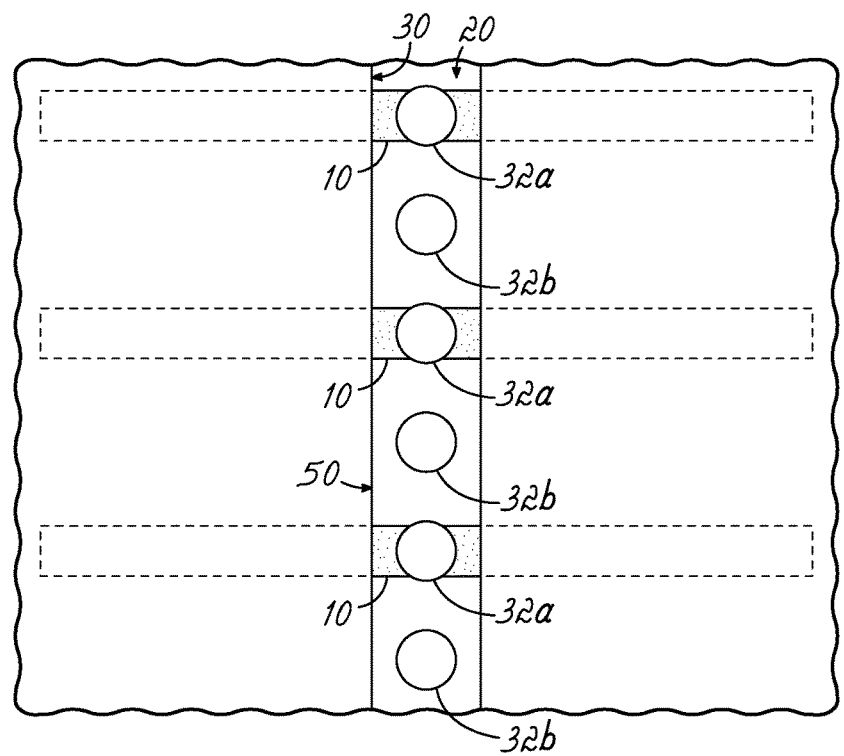
Figure 8C:
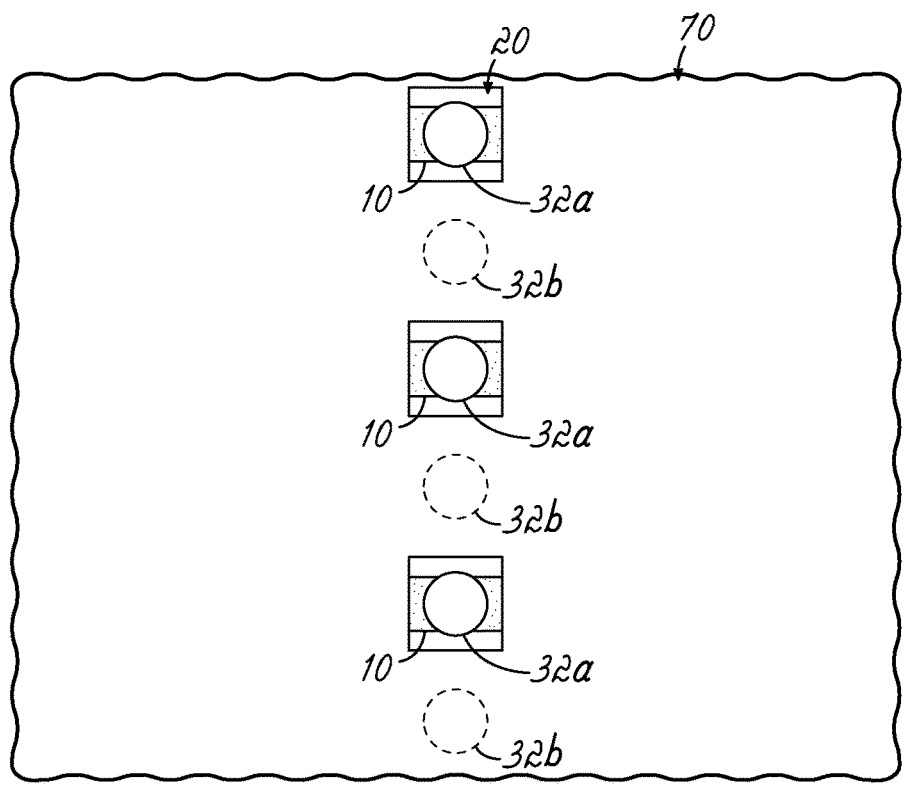

Another variant of this embodiment will occur where the layout dictates that there are not lines 10 for every single hole in the trench. In this case, the chemically modified topography 20 will still drive the placement of the contact holes that will make contact with the topography 20, i.e., lines 10, while the holes without the topography 20 will still be more constrained than they would be in the case without the chemically active topography 20, but will still have more error in their placement than those that are tethered. These non-contacting holes could be left as is (i.e., dummy holes). Alternatively, as depicted in the process flow FIGS. 8A-8C, these holes could be removed through a second patterning step where only the desired contact holes are opened in the second patterning step. FIG. 8A shows the template 30 formed over the topography 20, which includes a plurality of spaced lines 10. FIG. 8B depicts the result of the DSA process of the invention, with the cylinders 32a of the BCP 50 that correspond to the contact holes tethered to the lines 10 and the cylinders 32b that correspond to the non-contact holes not tethered to any underlying topography but still constrained within the template 30. FIG. 8C depicts the creation of a mask 70 for patterning the contact holes from the cylinders 32a.

For embodiments of the invention, there are control parameters that affect the generation of structures. Template shape parameters includes thickness, distance and slope. The template thickness may be on the order of 50-800 nm, for example. By way of further example, the template thickness may be on the order of 50-100 nm, but may in some cases vary up to 600-800 nm. In the embodiment described above in FIGS. 3A-3L, the material comprising the template 30 is also the bottom layer of a dual-layer ARC, and so the thickness selected must also serve to minimize reflectivity. The distance parameter is the distance that the template comes in proximity to the desired locations of the contact holes (e.g., 1.8 -2.5 $L_o$, where $L_o$ is the characteristic length of the BCP). The slope parameter refers to the sidewall slope of the template, for example, 80-90 degrees.

Topography shape parameters include height, width and slope. The topography height may be on the order of 1-25 nm, for example. By way of further example, the topography height may be 10-20 nm, or 15-25 nm, or around 15 nm. The topography width may be on the order of 15-25 nm, for example. The slope parameter refers to the sidewall slope of the topography, for example, 80-90 degrees.

Other control parameters relate to surface characteristics. The chemical activity of the template sidewall may be on the order of 0.2-1.6 $J/cm^2$, for example. The chemical activity of the topography may be on the order of 0.1-0.5 $J/cm^2$, for example. The chemical activity of the bottom surface of the template may be on the order of 0.2-2.0 $J/cm^2$, for example.

Other control parameters relate to the BCP. The percentage of the minority block of the BCP may be 25-40%, for example. The characteristic length, $L_o$, of the BCP is specifically selected to give the size of hole that is desired for a particular application, i.e., the target size of the contact hole. $\chi N$ of the BCP (product of chi parameter with degree of polymerization) may be on the order of 15-30 for PS/PMMA BCPs. As the $\chi$ of the BCP increases, it allows for a lower N to be used and still remain above the order/disorder transition. Lower N then translates to smaller features. The range quoted is based on the simulations done with PS/PMMA BCPs. For higher $\chi$BCPs, the value for $\chi N$ might exceed this range. The fill height of the BCP within the template may be on the order of 50-100%, for example, 70-100%, 70-90%, or 80-100%.

Since the invention utilizes both grapho- and chemo-epitaxy to drive the assembly of the block copolymer, a balance between the two driving forces is required. The template shape and topography shape dictate how much volume there is for the BCP to fill, and this will change as the structure of interest changes. The degree of chemo-epitaxy required will depend on how much grapho-epitaxy impetus is present, and so it too will depend on the geometry of the shape under consideration. Ultimately, it is believed that the volume of the shape, the percentage of the minority phase in the block copolymer, the $L_o$ of the block copolymer and the height above the template are related by a thermodynamic phenomenon and can be optimized to give the desired "graphical influence." The "chemical influence" needed will then be based on that. The V-shaped simulations discussed above provide an indication of the usable ranges for the control parameters, which are provided above by way of examples, but not limitations.

As described above, one of the methods for creating the template 30 is to etch it into the planarization layer 22 of a dual layer BARC 26, which planarization layer is typically a spin-on carbon film, or a CVD alpha-carbon film. In either case, it is largely organic, and etch transfer into this organic film is accomplished with an oxygen-containing etch process. The use of oxygen in this step leaves the exposed surfaces oxidized, which in turn makes them hydrophilic and preferentially favorable to wetting by PMMA in a PS-PMMA block copolymer.

Because the surfaces (sidewalls, topography, and trench floor) are so favorable for PMMA-wetting, most of PMMA in the BCP goes to wet these surfaces, and relatively little material is available for the formation of the morphology that would connect to the topography 20. Thus, in accordance with an embodiment of the invention, if the surfaces are shifted to a weaker PMMA wetting condition, the morphology changes dramatically by making more PMMA available to connect to the topography 20. Specifically, there is less PMMA along the sidewalls, and more available to form the connected morphology within the center of the template 30. This morphology has individual access points to the topography 20 through the PMMA structure, and with some engineering during the etch transfer, this morphology can be used to individually cut the lines 10 that are accessed through the connection.

In accordance with one embodiment using chemo-epitaxy in combination with grapho-epitaxy, a method to create a template 30 that has this low-wetting characteristic includes reverting to the natural state of the template 30 after the transfer etch (that uses oxidizing agent) to a less oxidized condition. One implementation is to change etch gases in the chamber to a more reductive chemistry, strike a plasma with low bias, and allow the plasma to bring the oxidative surface back toward a more neutral state (but still PMMA-wetting to a low degree). One example of a reducing chemistry is $H_2$. The $H_2$ plasma could be used, for example, during the over-etch. The reducing plasma can also be accomplished by moving to a separate chamber where the reducing plasma is struck. Reverting to the less oxidized condition can also be completed through wet processing. The wet chemical would likewise need to have reducing capability. While reductive chemistry is more difficult to accomplish in wet systems, since wet systems generally use aqueous delivery methods that typically include a lot of dissolved oxygen, it is conceived that HF can be used as a reducing wet chemistry, although it would have to be dilute to avoid destruction of the template or the underlying topography.

In an alternative embodiment, rather than treating the surfaces to make them less PMMA-wettable, the surfaces are treated to make them PS-wettable, i.e., the polarity is reversed. In accordance with this embodiment, the interior of the template 30 is coated with a PS-OH brush material. This brush can graft itself to the hydrophilic surface via the OH-portion, and the PS-portion of the polymer points away from the graft to give a PS-wettable surface. Then, when a PS-PMMA BCP is applied to the template 30, it is wetted by a PS layer instead of a PMMA layer. Fundamentally, this allows for all of the PMMA in the BCP to go toward creation of the morphology that will cut the lines 10.

Simulations were completed to determine the impact of changing the surface in this way. Energetically, the PMMA-PS-surface interaction was negative, and this resulted in a repulsion between the surfaces and the PMMA domain. Therefore, the PMMA domain rose over each line 10 of the topography 20 and tried to nestle itself between the lines 10 without touching them. This dual behavior, in addition to a repulsion from the sidewalls, led to self alignment of this structure over the topography. Fortuitously, the resulting topography in this scenario is such that the morphology opens to the air above each of the lines. The PMMA can then be wet developed out of this structure by first exposing to UV-light, and then applying a suitable organic solvent, as may be determined by persons of ordinary skill in the art. By way of example and not limitation, suitable solvents may include acetone, methanol, methyl ethyl ketone, methyl isobutyl ketone, 2-heptanone, n-butyl acetate, gamma butyrolactone, ethyl lactate, and PGMEA. Next, a directional etch can be used to use the open access points to cut the lines 10, and the cuts that are made will be more precise than could be made with the lithographical template alone. This provides for end to end spacing of lines that is more compact and favorable for transistor packing on silicon.

In practice, there are various paths of implementation for application of the PS-OH brush and its grafting to the surfaces. However, the implementation should take into account that the sidewalls, bottom surface, and topography may all be created out of different materials, which affects the wetting and grafting of the PS-OH brush to the different material surfaces. One method for applying the brush to the surfaces that have different material compositions is using a DCS cure. This process applies a very thin layer of silicon on top of all surfaces. That silicon layer is then oxidized by exposure to air or moisture. Oxidation may alternatively be accomplished with a plasma, by an in-situ ozonation created with 172 nm light+oxygen, or by a wet process where ozone is bubbled through water and applied to the wafer as an oxidation agent. TMAH-based photoresist developer may also be used to create terminating hydroxyl groups on the silicon surfaces. This treatment creates a more uniform hydroxy-terminated surface that can then be more uniformly "polarity-reversed" as the PS-OH brush is grafted to it.

While the present invention has been illustrated by a description of one or more embodiments thereof and while these embodiments have been described in considerable detail, they are not intended to restrict or in any way limit the scope of the appended claims to such detail. Additional alternatives, advantages and/or modifications will readily appear to those skilled in the art. For example, it may be possible to control the template topography and surfaces so that the cylinders land between the topographic lines instead of on top of them. Also, similar to the first disclosed embodiment, the application of the above method can be envisioned for use in situations other than attachment and cutting of an array of lines. The invention in its broader aspects is therefore not limited to the specific details, representative apparatus and method, and illustrative examples shown and described. Accordingly, departures may be made from such details without departing from the scope of the general inventive concept.

What is claimed is:

1. A method for forming a patterned topography on a substrate, comprising:
   providing a patterned substrate comprising exposed features formed atop, the exposed features forming an existing exposed topography, and a template for directed self-assembly (DSA) surrounding the existing exposed topography;
   filling the template with a block copolymer (BCP) to directly contact and cover the existing exposed topography;
   annealing the block copolymer (BCP) within the template to drive self-assembly in alignment with the existing exposed topography;
   developing the annealed block copolymer (BCP) to expose a directed self-assembly (DSA) pattern immediately overlying the existing exposed topography, and
   transferring the directed self-assembly pattern into the existing exposed topography, to form a patterned existing exposed topography,
   wherein the patterned existing exposed topography comprises a pattern of cut-away and uncut portions of the existing exposed topography.

2. The method of claim 1, further comprising:
   prior to filling the template, chemically treating one or more surfaces of the existing exposed topography, or the template, or both, to alter at least one surface property of the existing exposed topography or the template to create a difference in surface energy between the existing exposed topography and the template.

3. The method of claim 2, wherein creating the difference in surface energy includes chemically treating exposed surfaces of the existing exposed topography to render the existing exposed topography more attractive to one phase of the block copolymer (BCP) than the template.

4. The method of claim 2, wherein creating the difference in surface energy includes chemically treating the template to render the template less attractive to one phase of the block copolymer (BCP) than the existing exposed topography.

5. The method of claim 2, wherein the step of chemically treating comprises a polymer brush coating step.

6. The method of claim 2, wherein the step of chemically treating comprises applying a planarization layer.

7. The method of claim 1, wherein the template for directed self-assembly is formed in direct contact with an upper surface of the substrate and is located only in regions of the substrate not covered by the existing exposed topography, and the template for directed self-assembly does not overlie the existing exposed topography.

8. A method for forming a patterned topography on a substrate, comprising:
   providing a patterned substrate comprising exposed raised features formed atop, the exposed raised features forming an existing exposed topography, and a template for directed self-assembly (DSA) surrounding the existing exposed topography;

filling the template with a block copolymer (BCP) to directly contact and cover the existing exposed topography;

annealing the block copolymer (BCP) within the template to drive self-assembly in alignment with the existing exposed topography, and developing the annealed block copolymer (BCP) to expose a directed self-assembly (DSA) pattern immediately overlying the existing exposed topography.

9. The method of claim 8, further comprising:
transferring the directed self-assembly pattern into the existing exposed topography, to form a patterned existing exposed topography.

10. The method of claim 9, wherein the patterned existing exposed topography comprises a pattern of cut-away and uncut portions of the existing exposed topography.

11. The method of claim 8, further comprising:
prior to filling the template, chemically treating one or more surfaces of the existing exposed topography, or the template, or both, to alter at least one surface property of the existing exposed topography or the template to create a difference in chemical activity between the existing exposed topography and the template.

12. The method of claim 8, wherein the template for directed self-assembly is formed in direct contact with the upper surface of the substrate and is located only in regions of the substrate not covered by the existing exposed topography, and the template for directed self-assembly does not overlie the existing exposed topography.

13. A method for forming a patterned topography on a substrate, comprising:
providing a substrate having a first patterned topography comprising a plurality of raised features, and a template for directed self-assembly (DSA) surrounding the raised features with top and sidewall surfaces of the plurality of raised features exposed within the template;
filling the template with a block copolymer (BCP) to directly contact and cover the top and sidewall surfaces of the plurality of raised features;
annealing the block copolymer (BCP) within the template to drive self-assembly in alignment with the plurality of raised features whereby a first phase of the block copolymer (BCP) assembles on top of the top surfaces within a matrix of a second phase of the block copolymer (BCP), and
developing the annealed block copolymer (BCP) to remove the first phase and expose a directed self-assembly (DSA) pattern immediately overlying the top surfaces of the plurality of raised features.

14. The method of claim 13, further comprising:
transferring the directed self-assembly pattern into the first patterned topography to form a second patterned topography comprising uncut portions of the plurality of raised features and cut-away portions of the plurality of raised features.

15. The method of claim 13, further comprising:
prior to filling the template, chemically treating the top and sidewall surfaces of the plurality of raised features, or surfaces of the template, or both, to alter at least one surface property of the plurality of raised features or the template to create a difference in surface energy between the plurality of raised features and the template.

16. The method of claim 15, wherein creating the difference in surface energy includes chemically treating the top and sidewall surfaces of the plurality of raised features to render the raised features more attractive to the first phase of the block copolymer (BCP) than the template.

17. The method of claim 15, wherein creating the difference in surface energy includes chemically treating the template to render the template less attractive to the first phase of the block copolymer (BCP) than the raised features.

18. The method of claim 15, wherein the step of chemically treating comprises a polymer brush coating step.

19. The method of claim 15, wherein the step of chemically treating comprises applying a planarization layer.

20. The method of claim 13, wherein the template for directed self-assembly is formed in direct contact with an upper surface of the substrate and is located only in regions of the substrate not covered by the plurality of raised features, and the template for directed self-assembly does not overlie the plurality of raised features.

* * * * *